US011092300B2

(12) United States Patent
Schnabelrauch

(10) Patent No.: US 11,092,300 B2
(45) Date of Patent: Aug. 17, 2021

(54) VENTING APPARATUS HAVING A THERMOELECTRIC GENERATOR FOR CONTROLLING A DECORATIVE STRUCTURE

(71) Applicant: Justin Schnabelrauch, Ypsilanti, MI (US)

(72) Inventor: Justin Schnabelrauch, Ypsilanti, MI (US)

( * ) Notice: Subject to any disclaimer, the term of this patent is extended or adjusted under 35 U.S.C. 154(b) by 211 days.

(21) Appl. No.: 16/520,933

(22) Filed: Jul. 24, 2019

(65) Prior Publication Data

US 2020/0332975 A1 Oct. 22, 2020

Related U.S. Application Data

(60) Provisional application No. 62/836,953, filed on Apr. 22, 2019.

(51) Int. Cl.
| | | |
|---|---|---|
| *F21S 9/04* | (2006.01) |
| *H01L 35/32* | (2006.01) |
| *H01L 35/30* | (2006.01) |
| *F21V 29/54* | (2015.01) |
| *F21V 29/70* | (2015.01) |
| *F21V 29/60* | (2015.01) |
| *F21V 35/00* | (2006.01) |
| *F21S 13/12* | (2006.01) |
| *F21Y 115/10* | (2016.01) |

(52) U.S. Cl.
CPC ............... *F21S 9/04* (2013.01); *F21S 13/12* (2013.01); *F21V 29/54* (2015.01); *F21V 29/60* (2015.01); *F21V 29/70* (2015.01); *F21V 35/00* (2013.01); *H01L 35/30* (2013.01); *H01L 35/32* (2013.01); *F21Y 2115/10* (2016.08)

(58) Field of Classification Search
CPC ... F21S 9/04; F21S 13/12; F21S 13/14; F21V 29/54; F21V 29/83; F21V 35/00; F21V 35/003; F21V 35/006; H01L 35/00–34; H01L 37/00–04
See application file for complete search history.

(56) References Cited

U.S. PATENT DOCUMENTS

| | | | |
|---|---|---|---|
| 5,544,488 | A | 8/1996 | Reid |
| 6,301,194 | B1 * | 10/2001 | Cauchy ............... A01M 29/18 119/719 |
| 6,663,384 | B2 | 12/2003 | Papal |
| 9,564,572 | B2 | 2/2017 | Haider |
| 9,869,436 | B2 | 1/2018 | Park |
| 2004/0265760 | A1 | 12/2004 | Swearingen |
| 2005/0277076 | A1 | 12/2005 | Papal |
| 2013/0050995 | A1 * | 2/2013 | Hsu ..................... H01L 35/30 362/181 |
| 2018/0156403 | A1 | 6/2018 | Millan |

* cited by examiner

*Primary Examiner* — Sean P Gramling
(74) *Attorney, Agent, or Firm* — Mitchell Law PLLC; Matthew W. Mitchell

(57) ABSTRACT

A venting apparatus for a containerized candle is disclosed. The venting apparatus includes a thermoelectric device in thermal communication to a heat collector on a first side thereof, and a venting housing structure configured to engage a lip of the containerized candle, wherein the venting housing structure comprises a plurality of exhaust apertures having an upper edge flush with a surface of the heat collector.

15 Claims, 11 Drawing Sheets

VENTING APPARATUS HAVING A THERMOELECTRIC GENERATOR FOR CONTROLLING A DECORATIVE STRUCTURE

CROSS REFERENCE TO RELATED APPLICATIONS

This application claims the benefit of Provisional Application No. 62/836,953 filed on Apr. 22, 2019 which is hereby incorporated herein by reference.

TECHNICAL FIELD

This disclosure relates to decorative candles having moveable structures, and more particularly to a venting apparatus having a thermoelectric generator for controllable motion and preferential thermal dissipation over a candle container.

BACKGROUND

The statements in this section merely provide background information related to the present disclosure and may not constitute prior art.

Candles in jars, i.e., containerized candles have been used for many years, primarily for lighting and decoration purposes. More recently, scented container candles in apothecary jars or similarly shaped vessels have become widely used. Many of these containerized candles are sold in standard sizes and shapes.

One drawback of containerized candles is the inefficiency of their combustion, which leads to soot accumulation. This soot problem is exacerbated by scented oils within the wax. To address the combustion inefficiency, various vented lids or candle toppers were made to generate a laminar flow for better combustion. Shortly after, or concurrent with the introduction of these toppers, mechanized decorations were offered, taking advantage of the thermal energy to move aspects of the topper, such as the rotating topper decorations seen in U.S. Pat. Publ. No. 2005/0277076. This product is not electrical, and purely mechanical, being driven by the thermal exhaust of the lighted candle. The thermal exhaust rotates a turbine, which then rotates the decorative structure. Other rotating structures for containerized candles are known in the art such as U.S. Pat. Publ. Nos. 2004/0086815 and 2004/0265760.

The known art is disadvantaged in two primary ways. First, all rotating decorative structures are mechanically controlled and are therefore subject to changing thermal conditions and candle states. Known mechanical structures for candle jars are not able to move or be selectively controlled, which results in an inconsistent or nonexistent performance. Further, because the decorative aspects are moved directly by the candle exhaust, many are known to accumulate soot.

Secondly, the known venting structures do not vent enough thermal energy out of the structure. The known structures inhibit thermal dissipation by allowing heat to "pocket" or billow directly above the candle flame, which can overheat electrical devices. U.S. Pat. Publ. Nos. 2018/0156403 and 2005/0277076 and U.S. Pat. No. 9,869,436 all divert hot air to the side, but have an exhaust opening that is lower than a ceiling within the chamber, which allows the heat to "pocket".

Hence, there is a need for a venting apparatus having a thermoelectric generator for selectively controlling a decorative structure.

SUMMARY

A venting apparatus for a containerized candle is disclosed. The venting apparatus includes a thermoelectric device such as a TEG in thermal communication to a heat collector on a first side thereof, and a venting housing structure configured to engage a lip of the containerized candle, wherein the venting housing structure comprises a plurality of exhaust apertures having an upper edge flush with a surface of the heat collector, thereby inhibiting heat build-up which degrades or renders electrical devices inoperable.

BRIEF DESCRIPTION OF THE DRAWINGS

One or more embodiments will now be described, by way of example, with reference to the accompanying drawings, in which.

DETAILED DESCRIPTION

Figure 1:
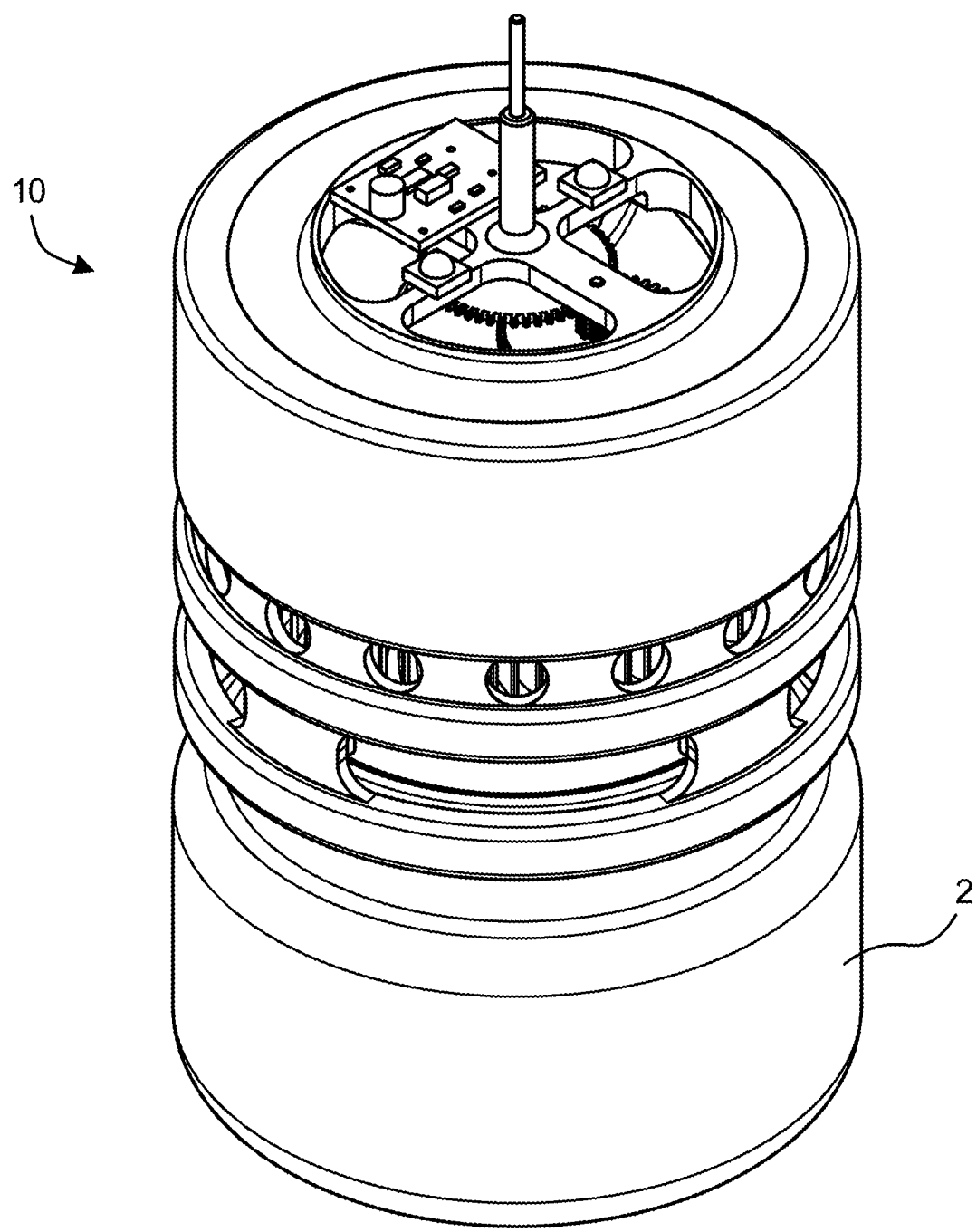
FIG. 1 shows an exemplary venting apparatus atop a candle, in accordance with the present disclosure.
Figure 2:
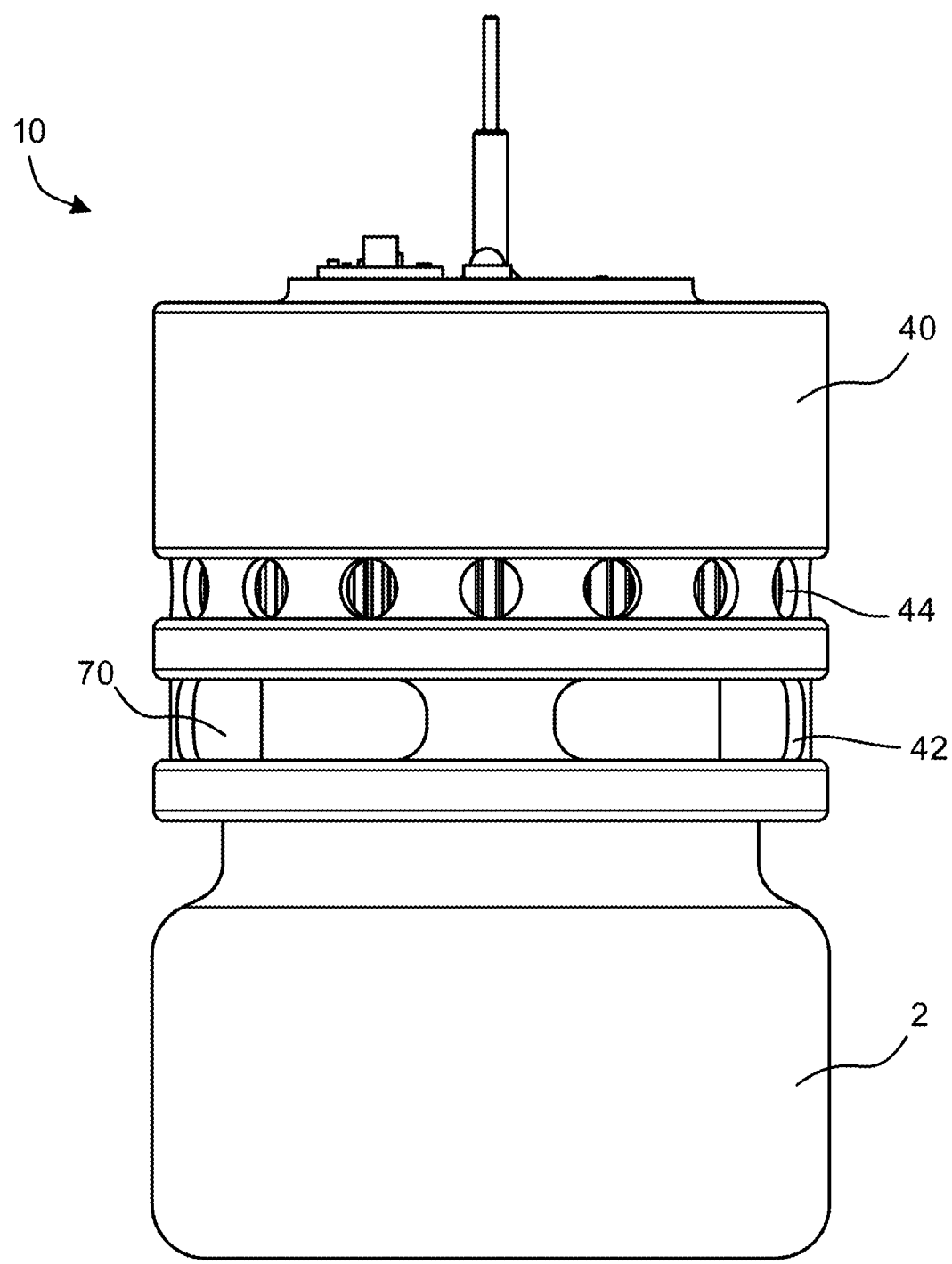
FIG. 2 is a side view of the venting apparatus, in accordance with the present disclosure.
Figure 3:
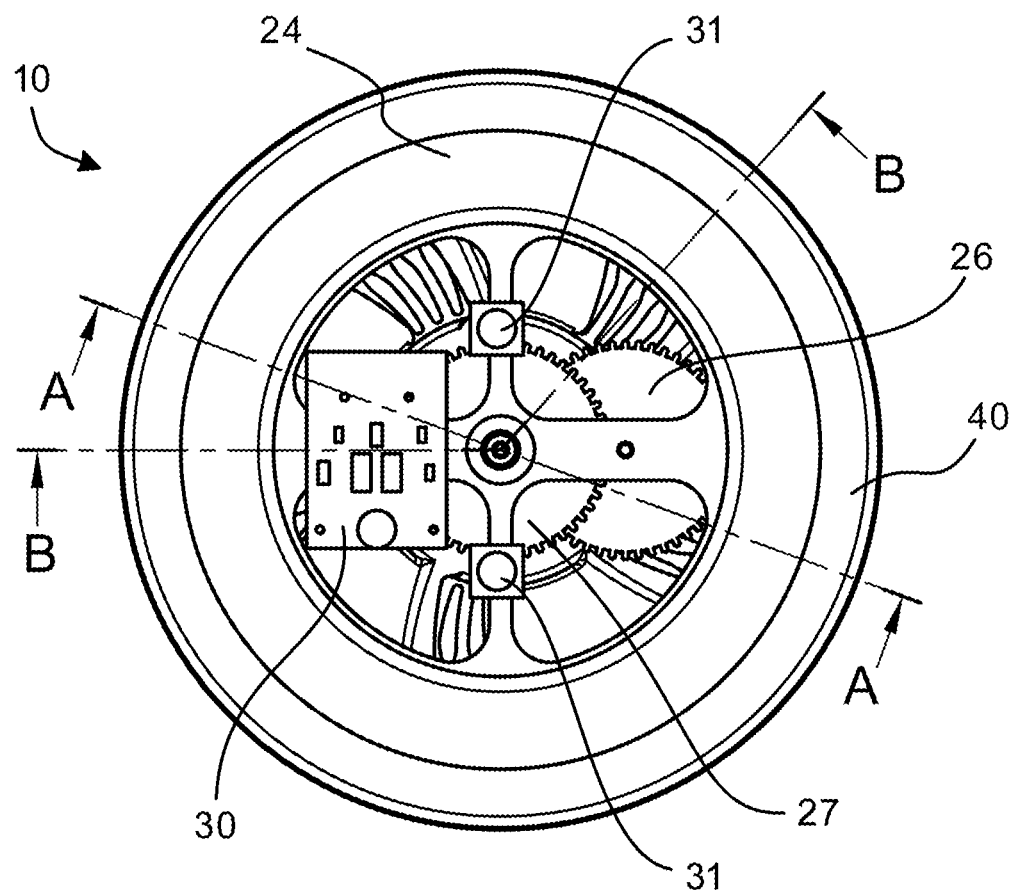
FIG. 3 is a top view of the venting apparatus, in accordance with the present disclosure.

Reference throughout this specification to "one embodiment," "an embodiment," or similar language means that a particular feature, structure, or characteristic described in connection with the embodiment is included in at least one embodiment of the subject matter of the present disclosure. Appearances of the phrases "in one embodiment," "in an embodiment," and similar language throughout this specification may, but do not necessarily, all refer to the same embodiment.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

As used in the description herein and throughout the claims, the following terms take the meanings explicitly associated herein, unless the context clearly dictates otherwise: the meaning of "a," "an," and "the" includes plural reference, the meaning of "in" includes "in" and "on." The term "based upon" is not exclusive and allows for being based on additional factors not described, unless the context clearly dictates otherwise. Additionally, in the subject description, the word "exemplary" is used to mean serving as an example, instance or illustration. Any embodiment or design described herein as "exemplary" is not necessarily to be construed as preferred or advantageous over other embodiments or designs. Rather, use of the word exemplary is intended to present concepts in a concrete manner.

Referring now to the drawings, wherein the depictions are for the purpose of illustrating certain exemplary embodiments only and not for the purpose of limiting the same, FIG. 1 shows an exemplary venting apparatus 10 having a thermoelectric generator. The venting apparatus 10 is shown resting atop a containerized candle 2. The venting apparatus 10 is shown without a decorative topping for ease of illustration. A decorative topping 80 such as shown in FIG. 10, may be coupled to the apparatus 10, when assembled for use.

The venting apparatus 10 is formed of a decoration engagement module 20, a venting housing structure 40, and a thermoelectric generator module 60. When assembled, the decoration engagement module 20 is mechanically connected to the thermoelectric generator module 60, such as via a gear or axle. The venting housing structure 40 may engage either or both of the modules 20 and 60 via a press-fit or friction fit. In one embodiment, the venting housing structure 40 uses protruding tabs for engagement to corresponding recesses on the modules 20 and 60 for secure coupling.

Figure 10:
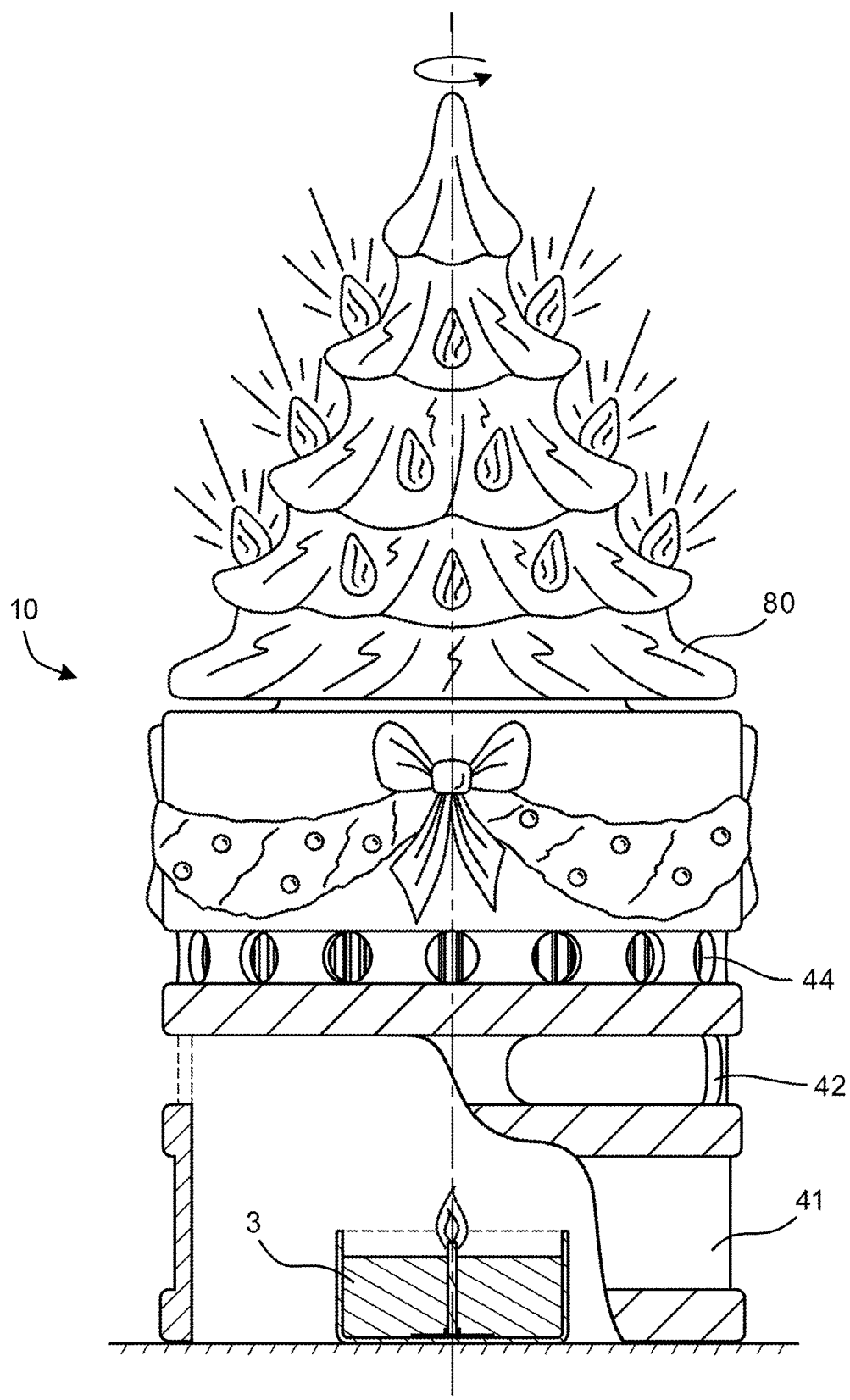
FIG. 10 is a partial cross-sectional view showing the venting apparatus having exemplary decorative elements, in accordance with the present disclosure.

The exemplary decoration engagement module 20 includes mechanical elements to engage decorative features of the apparatus 10, such as those shown in FIG. 10. In one embodiment, the decorative features are engaged via an axle 22, although the disclosure herein contemplates that gears and other mechanical elements may be used without departing from the teachings herein. The exemplary module 20 includes a control device 30, which may be electrically connected to the thermoelectric generator module 60 and the decorative features. One or more lighting devices 31 such as light-emitting diode(s) may be used for operational or diagnostic informational communication.

The decoration engagement module 20 preferably includes a support structure 24 that is sized and adapted for engagement to the venting housing structure 40, to support the control device 30, and for mechanical and electrical energy communication to the decorative features. In one embodiment, the decoration engagement module 20 is configured to mechanically couple to the thermoelectric generator module 60 via a connection gear 26. The connection gear 26 may be axially aligned with a second gear that is configured to transmit mechanical energy to an axle gear 27 of the axle 22. Although, it is contemplated herein that any number of mechanical arrangements may be used to communicate mechanical energy from the thermoelectric generator module 60 to the decorative features.

The venting housing structure 40 is generally cylindrically-shaped and includes a plurality of exhaust apertures 42 and a plurality of ambient apertures 44. The ambient apertures 44 are radially aligned with a central axis of the structure 40. The exemplary exhaust apertures 42 are generally radially aligned with a central axis of the structure 40. The ambient apertures 44 are positioned within the structure 40 to be proximate to a heat sink 62 when the venting housing structure 40 is assembled with the thermoelectric generator module 60. The exhaust apertures 42 are formed on the structure to be proximate to a heat collector 68 when the venting housing structure 40 is assembled with the thermoelectric generator module 60. The apertures 42 and 44 are preferably spaced circumferentially in any number so as to provide adequate ventilation and for structural integrity purposes of the venting housing structure 40.

The venting housing structure 40 is preferably a single contiguous, integral piece, but may be formed of any number of cylindrical-shaped structures. The structure is preferably formed of a non-combustible and low thermally conductive material such as poly resin or ceramic.

The thermoelectric generator module 60 is configured to generate electricity from a thermal potential generated in part by a lit candle, coupled to the venting housing structure 40, and communicate mechanical energy to one or more decorative elements 80, as desired. The exemplary module 60 includes a heat sink 62, an air shield 64, a thermoelectric device (i.e., a TEG device) 66, a heat collector 68, a gear 61, a cooling fan 63, an electric motor 65, and a coupling structure 67.

Figure 5:
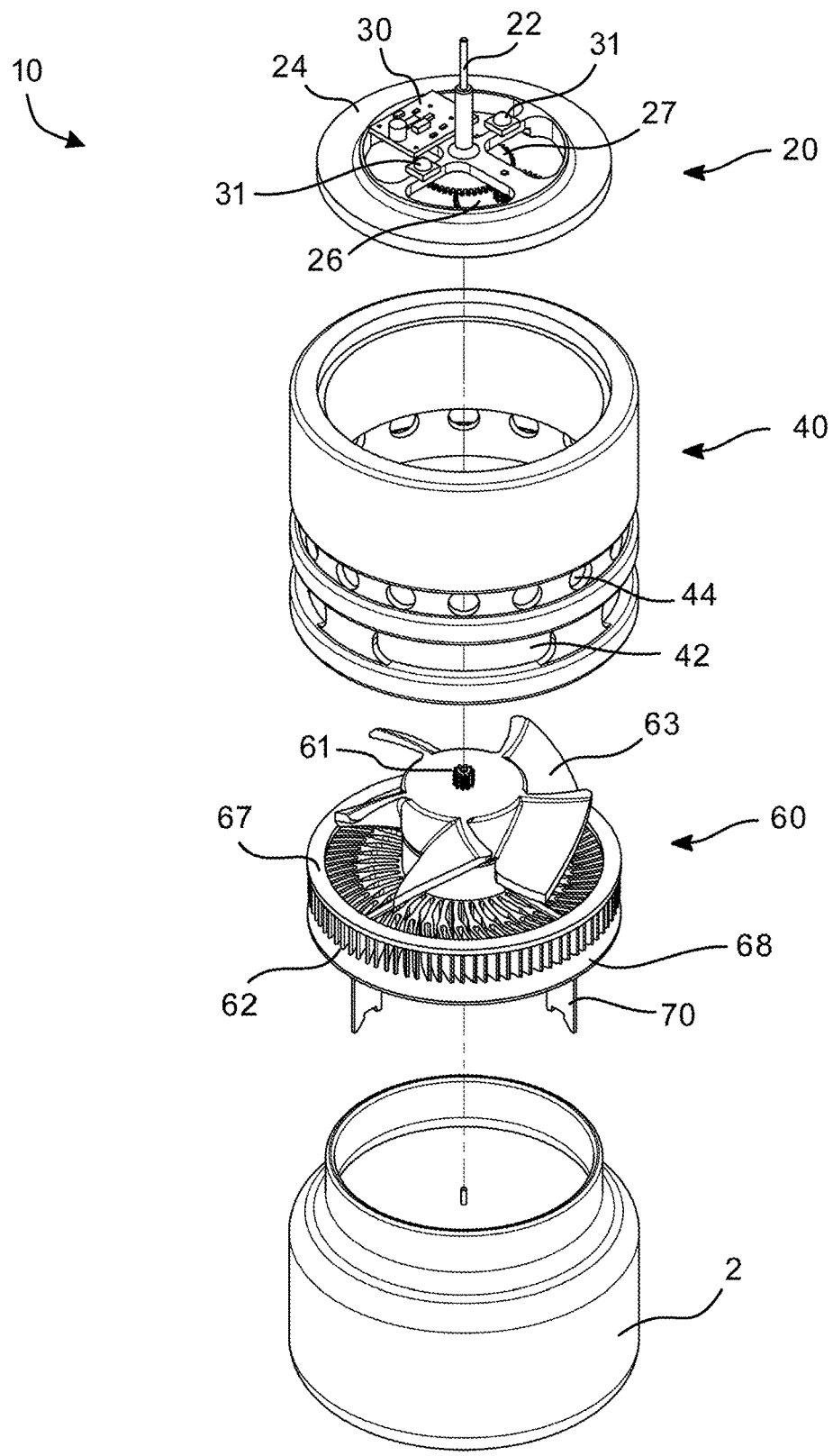
FIG. 5 is an exploded view of the venting apparatus, in accordance with the present disclosure.
Figure 6:
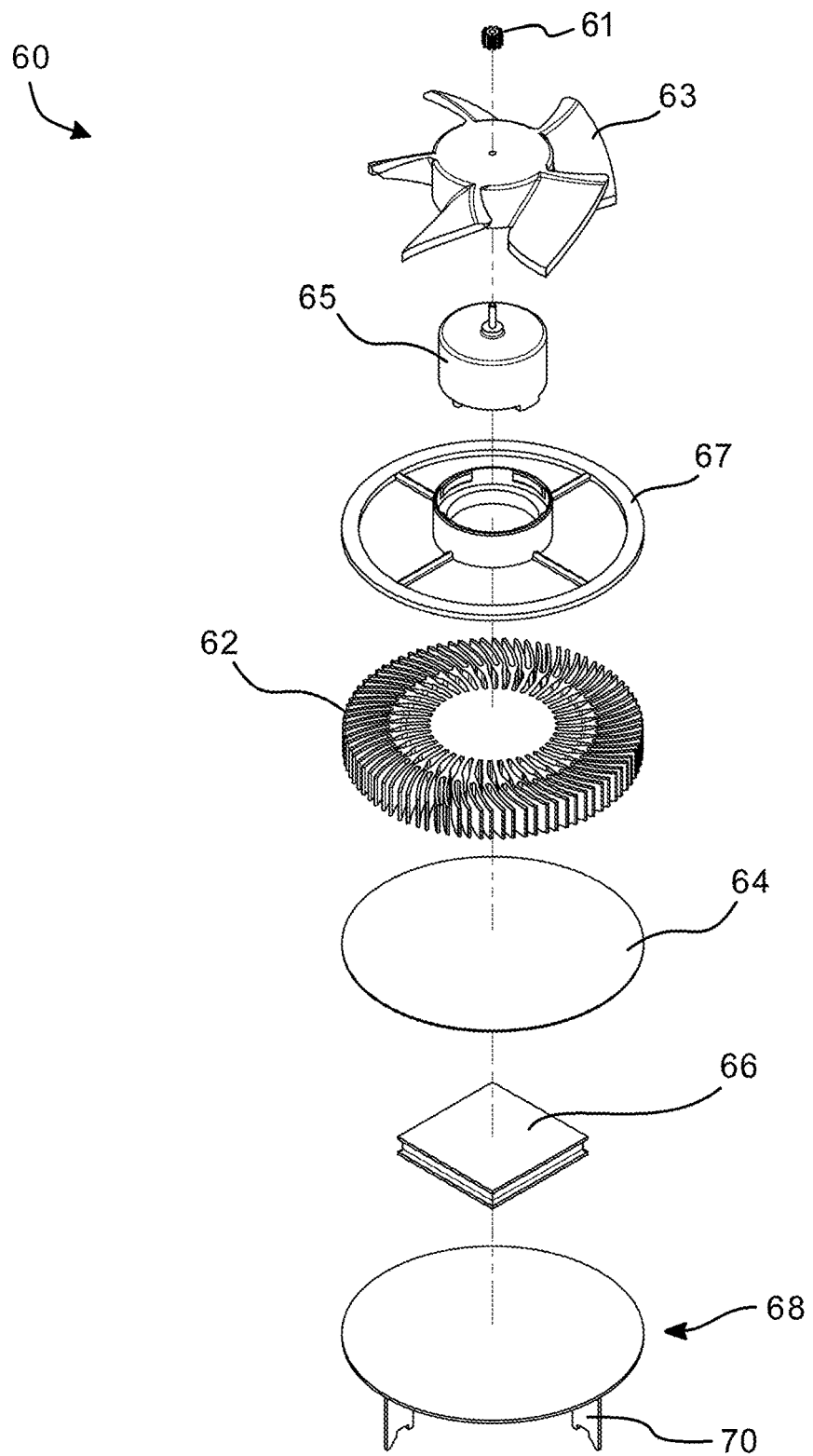
FIG. 6 is an exploded view of a thermoelectric generator module of the venting apparatus, in accordance with the present disclosure.

The gear 61 is axially connected or integral with an axle of the motor 65. The gear 61 is sized and shaped to engage a gear of the decoration engagement module 20 such as the connection gear 26 shown in FIG. 5.

The cooling fan 63 is axially connected or integral with an axle of the motor 65. The cooling fan 63 includes a plurality of blades oriented to either direct air at the heat sink or draw air away from the heat sink, depending on the direction of rotation.

The structure 67 includes a cylindrical, central portion having an opening that is configured to receive the motor 65. Any number of radially aligned spoke members provide support to the cylindrical central portion and an outer band that is sized and shaped for engagement to the heat sink 62. In one embodiment, the outer band of the structure 67 is further configured to engage an inner wall of the venting housing structure 40.

The heat sink 62 is connected to the air shield 64 or integral therewith. In one embodiment of the thermoelectric generator module 60, an air shield is not used, the heat sink 62 being directly attached to the thermoelectric device 66. The thermoelectric device 66 generates electricity when there is a thermal difference between the upper side and the bottom side, hence the heat sink 62, air shield 64, and cooling fan 63 are all configured to extract thermal energy from the upper side of the thermoelectric device 66.

The heat collector 68 is configured to contact the thermoelectric device 66 and transmit thermal energy to a bottom side thereof. The heat collector 68 is further configured to engage or rest atop a lip of the candle 2. In the exemplary embodiment of the heat collector 68, a plurality of engagement stands 70 are configured to straddle the lip of the candle 2 and engage a side thereof. The engagement stands 70 are radially aligned with a central axis of the thermoelectric generator module 60. In one embodiment, an inner edge 71 of the engagement stands 70 are radially spaced from the central axis of the thermoelectric generator module 60 at a greater distance than a radius of the candle 2. In this way, the engagement stands 70 will friction fit slightly to the candle 2 when pushed down thereupon.

Components of the thermoelectric generator module 60 may be fastened together by screws, bolts or adhesive. It is important that there is quality contact of either the air shield 64 or heat sink 62 to the upper side of the thermoelectric device 66 and by the heat collector 68 on the bottom side of the thermoelectric device 66. The tightness of the arrangement facilitates conductive heat transfer between the components for desirous thermoelectric power generation. In one embodiment, thermal paste or thermal pads may be used to enhance thermal conductivity between the thermoelectric device 66 and either or both of the air shield 64 and heat collector 68. In some embodiments, tabs may be used for connections of the various components. The tabs include a surface that is shaped to mate with one or more surfaces of another component to be positioned adjacent to the surface of the tab. Such surfaces can be used to provide support, force, and/or adjustment to one or more tabs being adjusted by the first and/or second component, among other benefits. The terms upper and bottom are used herein to aid the reader and are not to be viewed as limiting with respect to the embodiments of the present disclosure. Although shown as separate components for ease of illustration, some may be formed as an integral unit.

Figure 4:
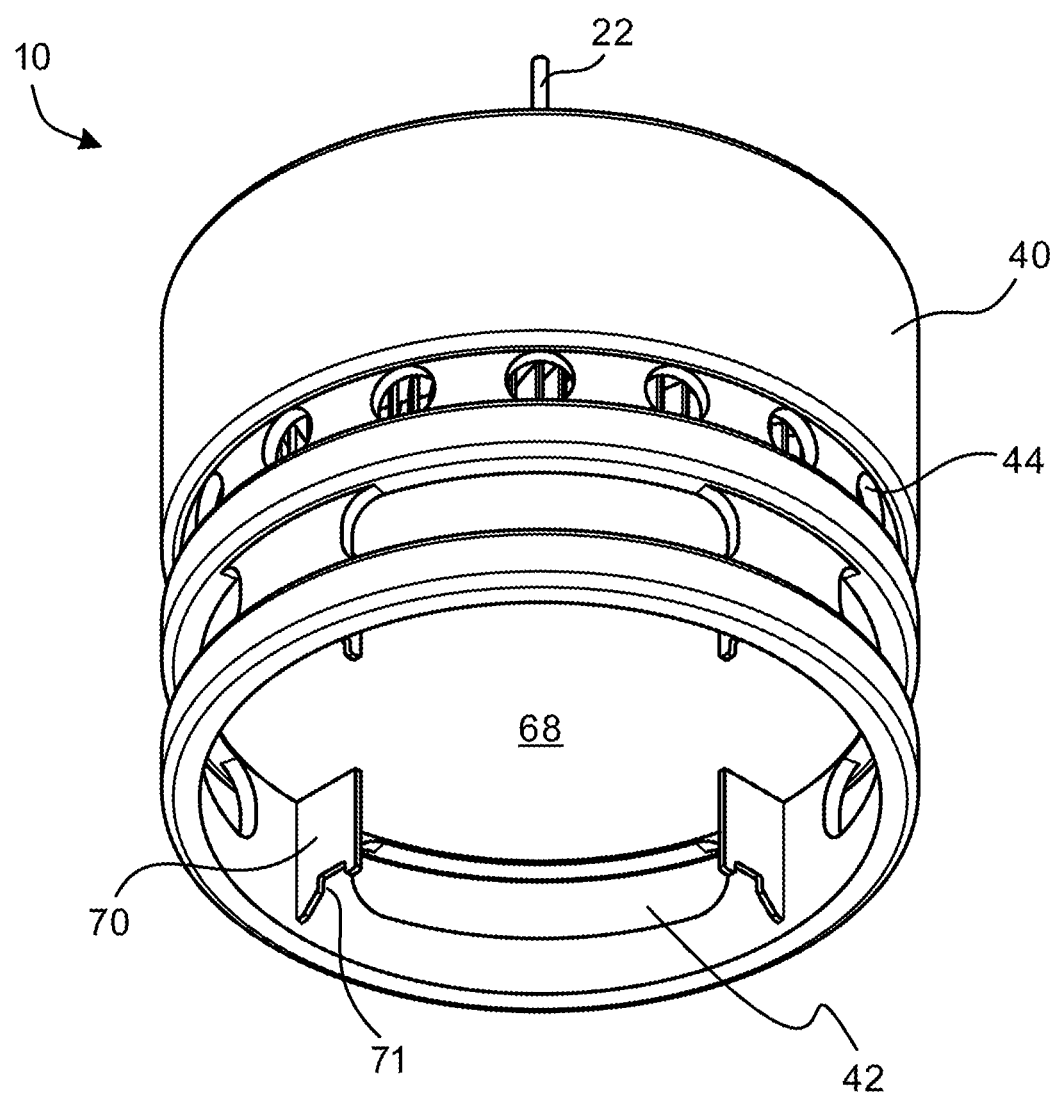
FIG. 4 is a bottom perspective view of the assembled venting apparatus, in accordance with the present disclosure.
Figure 7:
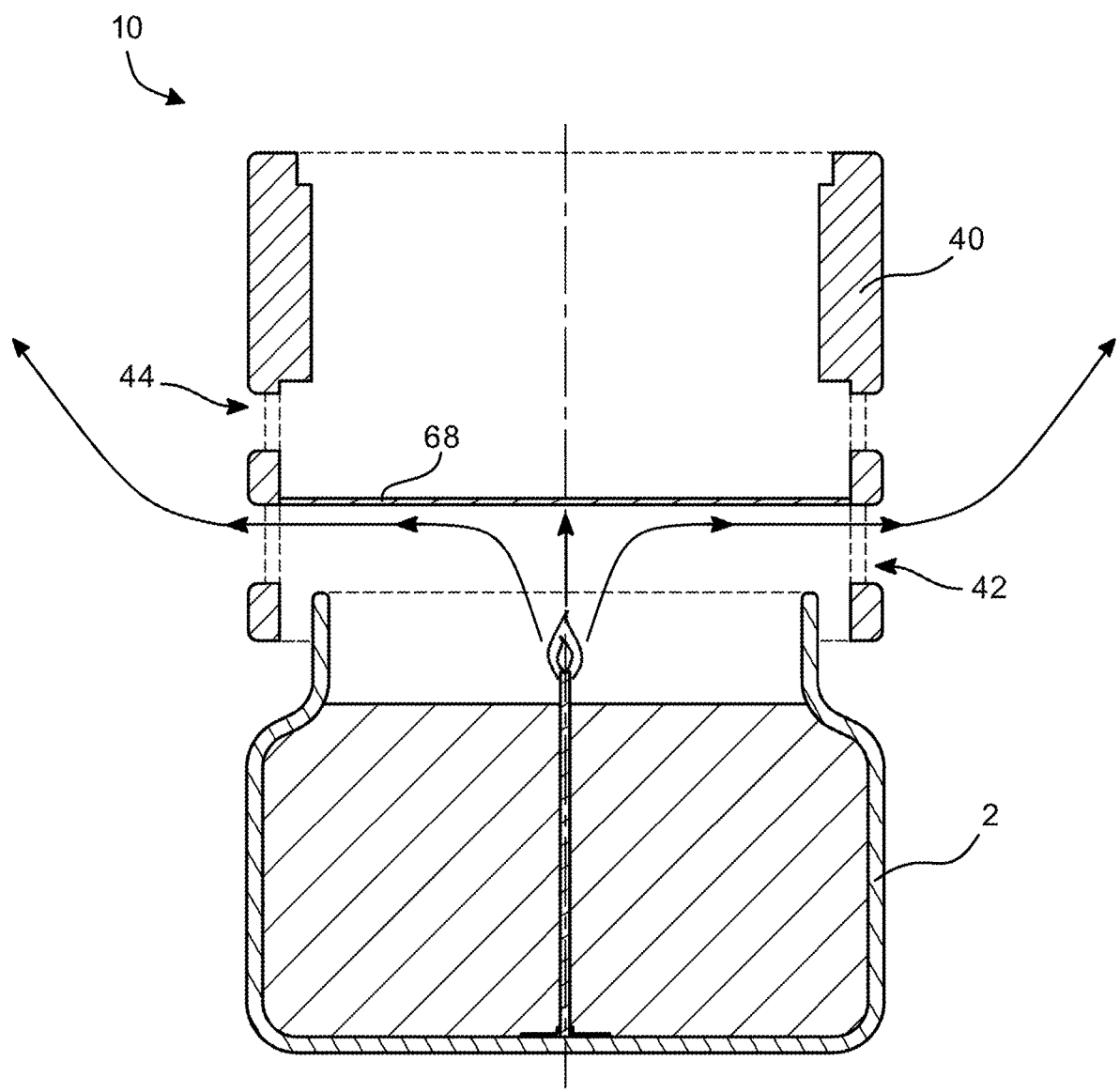
FIG. 7 is a cross-sectional view taken along line A-A of FIG. 3, in accordance with the present disclosure.
Figure 8:
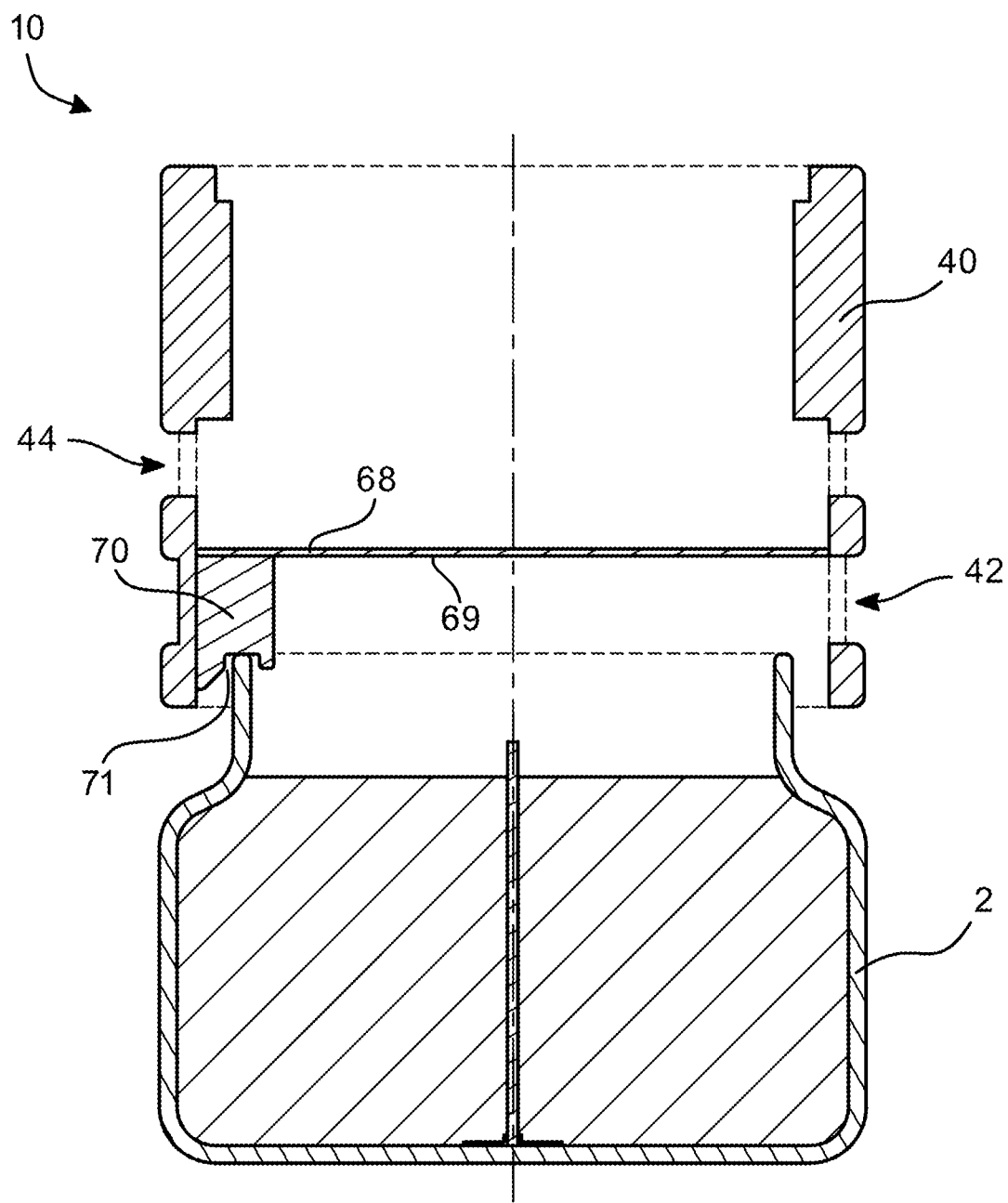
FIG. 8 is a cross-sectional view taken along line B-B of FIG. 3, in accordance with the present disclosure.

With specific reference to FIGS. 4, 7, and 8, the exhaust apertures 42 are shown proximate to the heat collector 68. As FIGS. 4, 7, and 8 show, a top of the aperture 42 is flush with a bottom surface 69 of the heat collector 68. In this way, thermal energy from the lit candle 2 is immediately exhausted, reducing thermal build-up, and allowing preferential thermal dissipation by inhibiting candle flame heat to "pocket" or billow. As FIG. 7 shows, thermal energy from the candle rises to the bottom surface 69, and then exhausts from the apertures 42. FIG. 8 shows the venting apparatus 10 in a cross-sectional view rotated on one side with respect to FIG. 7. As FIG. 8 shows, the engagement stands 70 are in the same horizontal plane as the apertures 42. The apertures 42 are formed between each of the engagement stands 70 to allow for preferential thermal exhaust.

Figure 9:
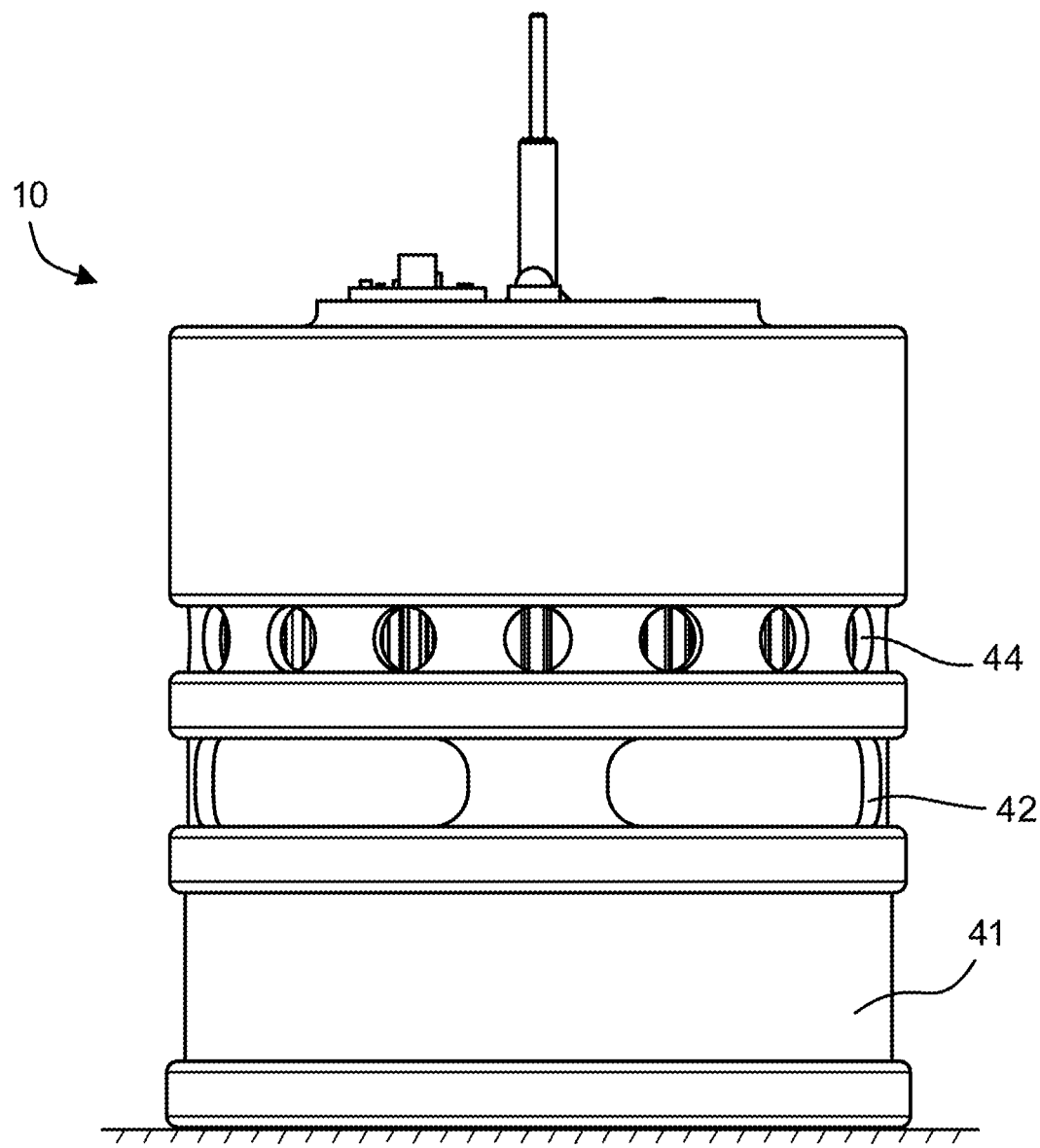
FIG. 9 shows a further embodiment of the venting apparatus, in accordance with the present disclosure.

With specific reference to FIGS. 9 and 10, a further embodiment of the venting apparatus 10 is shown which is intended to rest flush on a surface, such as a table, over a heat source, such as tea light candle(s) 3. This embodiment does not include the stands 70, but includes an additional venting housing structure portion 41, which is preferably integral with the rest of the venting housing structure 40. The venting housing structure portion 41 is a cylindrically-shaped portion, consistently shaped with the rest of the venting housing structure 40.

Figure 11A:
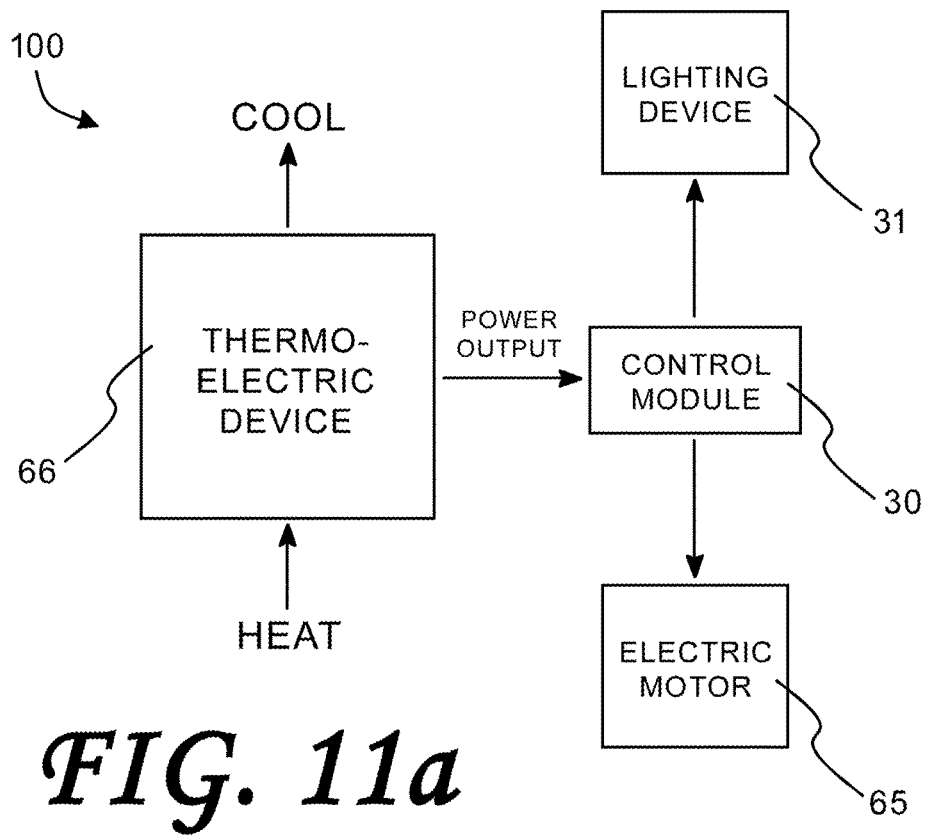
FIGS. 11A and 11B schematically show embodiments of a system for controlling the venting apparatus, in accordance with the present disclosure.
Figure 11B:
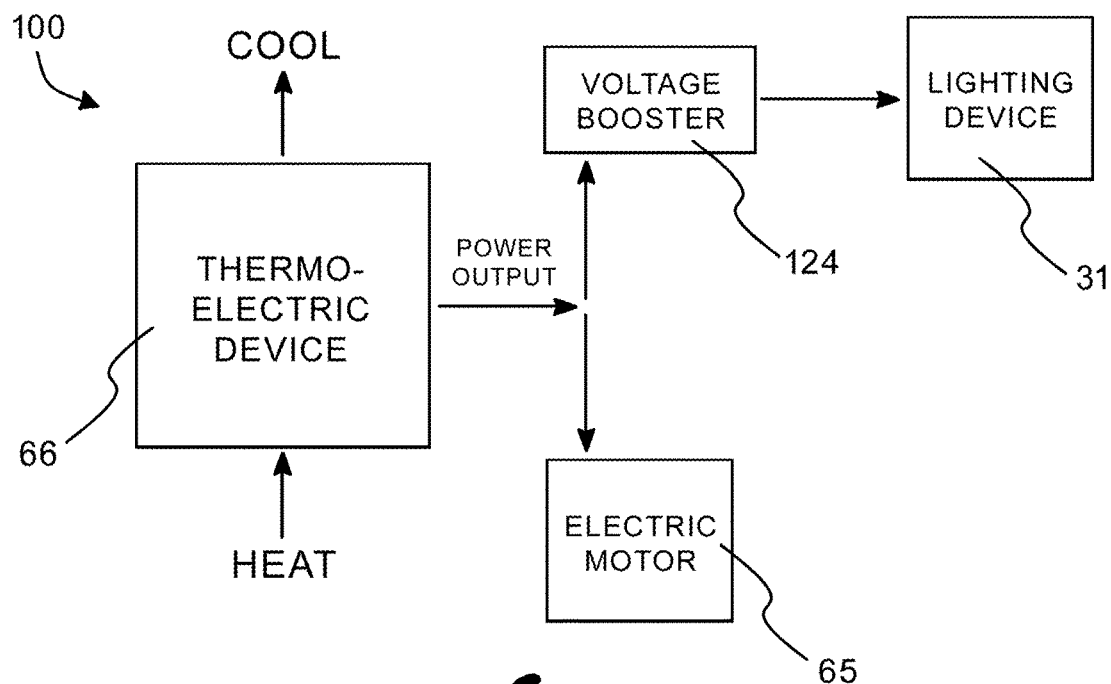

FIGS. 11A and 11B show embodiments of a system 100 that may be used to implement the teachings described herein. As FIGS. 11A and 11B shows, the system 100 includes a thermoelectric device 66 and an electric motor 65. Various embodiments can include a voltage regulator such as a voltage booster 124 and/or a lighting device 31. In operation, heat is supplied from a heat source such as a tea light or containerized candle. This thermal energy is converted to electrical energy by the thermoelectric device 66, which outputs electrical energy to the motor 65 and the voltage booster 124 and lighting device 31.

In the embodiment of the system 100 shown in FIG. 11A, a control module 30 receives the electrical energy from the thermoelectric device 66, which may then be selectively communicated to the motor 65 and the lighting device 31. In one embodiment of the control module 30, it is configured to modulate voltage and power from the thermoelectric device 66 before external communication thereof. In one embodiment, the control module 30 is configured to control the speed and power of the motor 65.

In the embodiment of the system 100 shown in FIG. 11B, the voltage regulator 124 and the electric motor 65 receive electricity direct from the thermoelectric device 66, which may be selectively applied before or after the devices via an actuatable switch.

In use, the venting apparatus 10 is placed on the candle 2 after the wick is lit. The heat collector 68 absorbs thermal energy rising from the lit candle 2. The thermal energy is transmitted to a bottom side of the thermoelectric device 66, creating a thermal difference between the top and bottom sides, which is converted to electrical energy therein taking advantage of the Seebeck effect. The electricity may be communicated to the control module 30 via electrical wires (not shown). The heat sink 62 dissipates heat to the environment through forced convection, which can be aided by the air shield 64 and/or the cooling fan 63.

In one embodiment, the cooling fan 63 provides forced convection air flow through the fins of the heat sink 62 to improve heat dissipation. The cooling fan 63 is propelled by an electric motor 65 which can be powered with electricity from the thermoelectric device 66 either directly, or through the control module 30. The electric motor 65 and cooling fan 63 preferably have a common rotational axis and common central axis. In one embodiment, the cooling fan 63 provides consistent cooling for stable power generation that is not easily affected by fluctuating ambient air temperatures.

While the foregoing disclosure discusses illustrative embodiments, it should be noted that various changes and modifications could be made herein without departing from the scope of the described embodiments as defined by the appended claims. Accordingly, the described embodiments are intended to embrace all such alterations, modifications and variations that fall within scope of the appended claims. Furthermore, although elements of the described embodiments may be described or claimed in the singular, the plural is contemplated unless limitation to the singular is explicitly stated. Additionally, all or a portion of any embodiment may be utilized with all or a portion of any other embodiments, unless stated otherwise.

The invention claimed is:

1. A venting apparatus for a heat source, the venting apparatus comprising:
   a venting housing structure comprising a plurality of exhaust apertures proximate to a heat collector, wherein the heat collector has a flat, circular-shaped first surface; and
   a thermoelectric device in thermal communication to the heat collector on a second surface thereof, wherein the thermoelectric device is coupled to a heat sink on a side opposite the heat collector, and electrically coupled to a motor, wherein the motor is mechanically connected to a cooling fan configured to thermally affect the heat sink; and
   a decoration engagement module mechanically connected to the motor, wherein the decoration engagement module includes a control device electrically connected to the thermoelectric device.

2. The venting apparatus of claim 1, wherein the venting housing structure is configured to engage a lip of a containerized candle.

3. The venting apparatus of claim 1, wherein the plurality of exhaust apertures have an upper edge flush with a surface of the heat collector.

4. The venting apparatus of claim 1, wherein the exhaust apertures are spaced circumferentially with a central axis of the venting apparatus.

5. The venting apparatus of claim 1, wherein the exhaust apertures are radially aligned with a central axis of the venting apparatus.

6. The venting apparatus of claim 1, wherein the venting housing is cylindrically-shaped.

7. The venting apparatus of claim 1, wherein the motor is coupled to a support structure having a cylindrical, central portion having an opening that is configured to receive the motor, the cylindrical central portion being supported by a number of radially aligned spoke members, wherein the support structure is configured to engage an inner wall of the venting housing structure.

8. A venting apparatus for a heat source, the venting apparatus comprising:
a cylindrically-shaped venting housing structure comprising a plurality of exhaust apertures proximate to a heat collector, having a flat, circular-shaped first surface, wherein the plurality of exhaust apertures are radially aligned with a central axis of the venting apparatus; and
a thermoelectric device in thermal communication to the heat collector on a second surface thereof and in thermal communication to a heat sink on an opposing side thereof, wherein the thermoelectric device is electrically coupled to a motor wherein the motor is coupled to a support structure having a cylindrical, central portion having an opening that is configured to receive the motor, the cylindrical central portion being supported by a number of radially aligned spoke members, wherein the support structure is configured to engage an inner wall of the venting housing structure;
a decoration engagement module mechanically connected to all the motor, wherein the decoration engagement module includes a control device electrically connected to the thermoelectric device; and
wherein the decoration engagement module further includes one or more lighting devices.

9. The venting apparatus of claim 8, wherein the plurality of exhaust apertures have an upper edge flush with a surface of the heat collector.

10. The venting apparatus of claim 8, wherein the exhaust apertures are spaced evenly, circumferentially with a central axis of the venting apparatus.

11. The venting apparatus of claim 8, wherein the motor is mechanically connected to a cooling fan configured to thermally affect the heat sink.

12. The venting apparatus of claim 8, wherein the venting housing structure is configured to engage a lip of a containerized candle.

13. A venting apparatus for a heat source, the venting apparatus comprising:
a cylindrically-shaped venting housing structure configured to support a thermoelectric device, the venting housing structure comprising a plurality of exhaust apertures proximate to a heat collector, having a first surface, and a plurality of ambient air apertures proximate to a heat sink, wherein the plurality of exhaust apertures and the ambient air apertures are radially aligned with a central axis of the venting apparatus, wherein the plurality of exhaust apertures have an upper edge flush with a surface of the heat collector;
a thermoelectric device in thermal communication to the heat collector on a second surface thereof and in thermal communication to an air shield and the heat sink on an opposing side thereof, wherein the thermoelectric device is electrically coupled to a motor; and
a decoration engagement module mechanically connected to a motor electrically connected to the thermoelectric device, wherein the decoration engagement module includes a control device electrically connected to the thermoelectric device, wherein the motor is mechanically connected to a cooling fan configured to thermally affect the heat sink by directing air through the plurality of ambient air apertures.

14. The venting apparatus of claim 13, wherein the motor is coupled to a support structure having a cylindrical, central portion having an opening that is configured to receive the motor, the cylindrical central portion being supported by a number of radially aligned spoke members, wherein the support structure is configured to engage an inner wall of the venting housing structure.

15. The venting apparatus of claim 14, wherein the venting housing structure further comprises a plurality of engagement stands configured to straddle and engage a lip of a containerized candle, wherein the engagement stands are radially aligned with the central axis of the venting apparatus and spaced evenly around a circumference thereof.

* * * * *